_(12)_ United States Patent
Lee et al.

(10) Patent No.: US 10,133,284 B2
(45) Date of Patent: Nov. 20, 2018

(54) CIRCUITS FOR SETTING REFERENCE VOLTAGES AND SEMICONDUCTOR DEVICES INCLUDING THE SAME

(71) Applicant: SK hynix Inc., Icheon-si Gyeonggi-do (KR)

(72) Inventors: Seung Hun Lee, Icheon-Si (KR); Won Kyung Chung, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/694,336

(22) Filed: Sep. 1, 2017

(65) Prior Publication Data

US 2017/0364108 A1    Dec. 21, 2017

Related U.S. Application Data

(62) Division of application No. 15/041,258, filed on Feb. 11, 2016, now Pat. No. 9,785,158.

(30) Foreign Application Priority Data

Sep. 10, 2015    (KR) .......................... 10-2015-0128235

(51) Int. Cl.
 *G05F 3/02* (2006.01)
 *G05F 1/10* (2006.01)
 *G11C 5/14* (2006.01)

(52) U.S. Cl.
 CPC ............... *G05F 1/10* (2013.01); *G11C 5/147* (2013.01)

(58) Field of Classification Search
 CPC .............. G05B 19/042; G05B 19/0421; G05B 19/0423; G05B 19/0425; G05B 19/0426; G05B 2219/2639; G11C 5/147; G11C 7/1084; G11C 7/1093
 USPC .......................................................... 327/540
 See application file for complete search history.

(56) References Cited

U.S. PATENT DOCUMENTS

| | | | |
|---|---|---|---|
| 2001/0054760 A1 | 12/2001 | Ito et al. | |
| 2010/0061160 A1* | 3/2010 | Jeong | G01K 3/005 365/189.07 |
| 2012/0008431 A1* | 1/2012 | Lee | G11C 5/147 365/191 |
| 2013/0162342 A1* | 6/2013 | Song | G11C 5/147 327/543 |
| 2014/0153344 A1 | 6/2014 | Kim | |
| 2014/0197524 A1 | 7/2014 | Chen | |
| 2014/0368238 A1 | 12/2014 | Song | |

FOREIGN PATENT DOCUMENTS

| | | |
|---|---|---|
| KR | 1020140146355 A | 12/2014 |
| KR | 1020150041385 A | 4/2015 |

* cited by examiner

*Primary Examiner* — Patrick Chen
(74) *Attorney, Agent, or Firm* — William Park & Associates Ltd.

(57) ABSTRACT

A circuit for setting a reference voltage is provided. The circuit includes a reference voltage information storage unit and a reference voltage input/output (I/O) control unit. The reference voltage information storage unit is configured to set a level of a reference voltage according to information stored in a first register or a second register if a training operation starts in a first set mode. The reference voltage I/O control unit is configured to set a level of the reference voltage according to first data or second data if the training operation starts in a second set mode.

10 Claims, 8 Drawing Sheets

CIRCUITS FOR SETTING REFERENCE VOLTAGES AND SEMICONDUCTOR DEVICES INCLUDING THE SAME

CROSS-REFERENCE TO RELATED APPLICATIONS

The present application is divisional application of U.S. application Ser. No. 15/041,258, filed on Feb. 11, 2016, and claims priority under 35 U.S.C. § 119(a) to Korean Patent Application No. 10-2015-0128235, filed on Sep. 10, 2015, in the Korean Intellectual Property Office, which is incorporated herein by reference in its entirety as set forth in full.

BACKGROUND

1. Technical Field

Embodiments of the present disclosure relate to circuits for setting reference voltages and semiconductor devices including the same.

2. Related Art

In general, an integrated circuit (IC) such as a semiconductor IC may include a semiconductor system that receives external signals supplied from an external system to generate internal signals. The semiconductor system may compare the external signals with a reference voltage and may buffer the external signals to generate internal signals used in internal circuits of the semiconductor system. The internal signals may set logic levels based on results of comparisons of the external signals and the reference voltage. For example, the internal signal may be set to a logic "high" level if a voltage level of the internal signal is higher than the reference voltage, and the internal signal may be set to a logic "low" level if a voltage level of the internal signal is lower than the reference voltage. The reference voltage inputted to the semiconductor system may have an intermediate level between a predetermined maximum level (VILmax) and a predetermined minimum level (VILmin). However, a level of the reference voltage may fluctuate according to an environmental condition, noises of power signals of a system, shapes of interconnection lines of a printed circuit board (PCB), and/or shapes of interconnection lines of a package. If a level of the reference voltage fluctuates, the semiconductor system may incorrectly recognize levels of the external signals and thus may generate internal signals having incorrect logic levels which may cause a malfunction of the internal circuits. Thus, it may be important to verify and confirm the reference voltage level so that the semiconductor system receives the external signals correctly.

Recently, a command bus training (CBT) scheme for finding a range of a level of the reference voltage and for setting a level of the reference voltage has been widely used in an initialization operation such as a booting operation of a semiconductor device to enable the semiconductor device to operate normally.

SUMMARY

Various embodiments are directed to circuits for setting reference voltages and semiconductor devices including the same.

According to an embodiment, there is provided a circuit for setting a reference voltage. The circuit includes a reference voltage information storage unit and a reference voltage input/output (I/O) control unit. The reference voltage information storage unit is configured to set a level of a reference voltage according to information stored in a first register or a second register if a training operation starts in a first set mode. The reference voltage I/O control unit is configured to set a level of the reference voltage according to first data or second data if the training operation starts in a second set mode.

According to another embodiment, a semiconductor device includes a first channel and a second channel. The first channel is configured to include a first data pad portion receiving first data in a first input mode and in a second input mode and a second data pad portion receiving second data in the first input mode. The first channel is configured to set a level of a first reference voltage according to the first data or the second data. The second channel is configured to include a third data pad portion receiving the first data in the first and second input modes and a fourth data pad portion receiving the second data in the first input mode. The second channel is configured to set a level of a second reference voltage according to the first data or the second data.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

Figure 1:
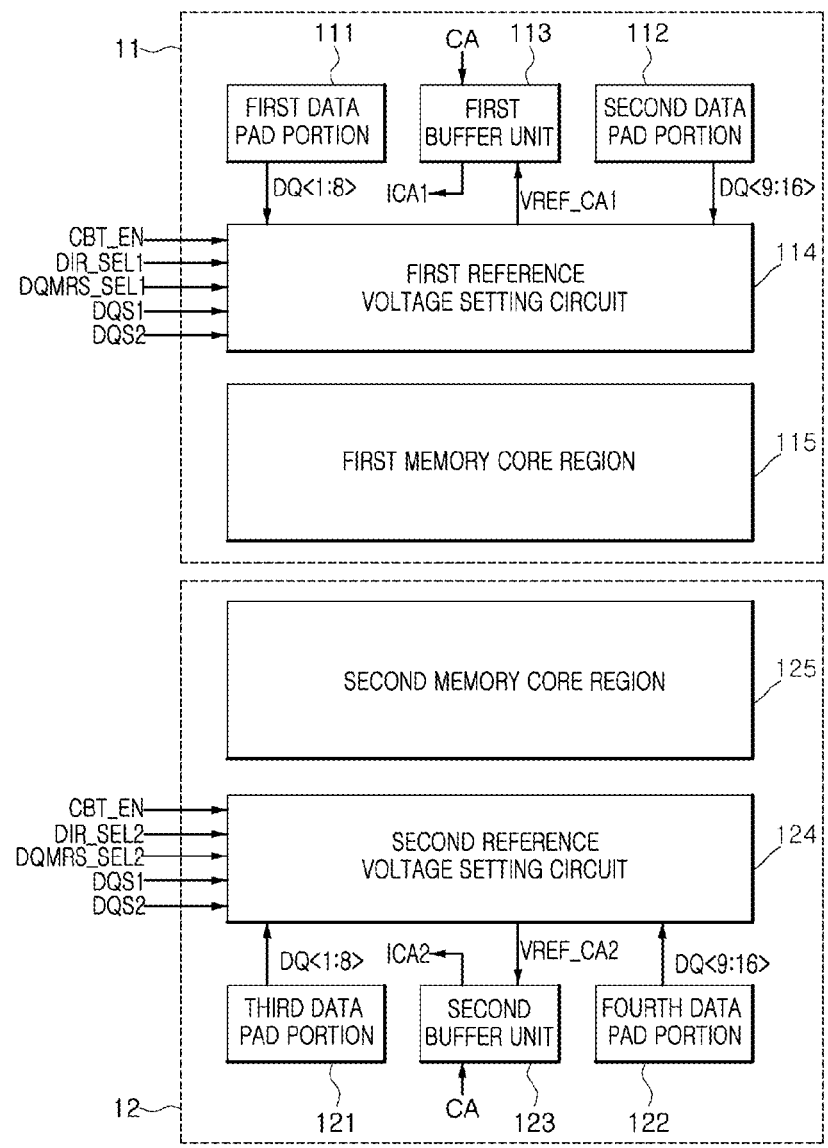
FIG. 1 is a block diagram illustrating a semiconductor device according to an embodiment.

As illustrated in FIG. 1, a semiconductor device 1 according to an embodiment may include a first channel 11 and a second channel 12. The first channel 11 may include a first data pad portion 111, a second data pad portion 112, a first buffer unit 113, a first reference voltage setting circuit 114, and a first memory core region 115. The second channel 12 may include a third data pad portion 121, a fourth data pad portion 122, a second buffer unit 123, a second reference voltage setting circuit 124 and a second memory core region 125.

The first reference voltage setting circuit 114 may receive first data DQ<1:8> through the first data pad portion 111 in a first input mode and in a second input mode. The first reference voltage setting circuit 114 may receive second data DQ<9:16> through the second data pad portion 112 in the first input mode. The first reference voltage setting circuit 114 may set a level of a first reference voltage VREF_CA1 in response to a training start signal CBT_EN, a first disposition selection signal DIR_SEL1, a first input selection signal DQMRS_SEL1, a first strobe signal DQS1, and a second strobe signal DQS2. The first buffer unit 113 may buffer a command/address signal CA to generate a first internal command/address signal ICA1, in response to the first reference voltage VREF_CA1. The command/address signal CA may be set to include both commands and addresses, or the command/address signal CA may include the commands or the addresses. A detailed configuration and a detailed operation of the first reference voltage setting circuit 114 will later be described with reference to FIGS. 2 to 6.

The first input mode may be defined as a mode in which thirty two bits of data are inputted to the semiconductor device 1, and the second mode may be defined as a mode in which sixteen bits of data are inputted to the semiconductor device 1. The training start signal CBT_EN may be enabled to execute a command bus training (CBT) operation for setting levels of the first reference voltage VREF_CA1 and a second reference voltage VREF_CA2. The first disposition selection signal DIR_SEL1 may be set to have a logic "low" level if the first and second data pad portions 111 and 112 are disposed on an end of the first channel 11 opposite to the second channel 12. Alternatively, the first disposition selection signal DIR_SEL1 may be set to have a logic "high" level according to embodiments. The first input selection signal DQMRS_SEL1 may be set to have a logic "low" level in a first set mode. The first test mode may be a mode in which the first reference voltage setting circuit 114 adjusts a level of the first reference voltage VREF_CA1 using information stored in the first reference voltage setting circuit 114. The first input selection signal DQMRS_SEL1 may be set to have a logic "high" level in a second set mode. The second test mode may be a mode in which the first reference voltage setting circuit 114 adjusts a level of the first reference voltage VREF_CA1 using the first data DQ<1:8> or the second data DQ<9:16>. A logic level of the first input selection signal DQMRS_SEL1 may be set according to a status of an electrical connection between a first input selection signal DQMRS_SEL1 pad of the semiconductor device 1 and a specific pin of a package substrate (not shown). The logic level of the first input selection signal DQMRS_SEL1 may also be set according to the embodiment. The first strobe signal DQS1 may be enabled if the first data DQ<1:8> are inputted to the first channel 11 through the first data pad portion 111. A logic level of an enabled first strobe signal DQS1 may be set to be different according to the embodiments. The second strobe signal DQS2 may be enabled if the second data DQ<9:16> are inputted to the first channel 11 through the second data pad portion 112. A logic level of an enabled second strobe signal DQS2 may be set to be different according to the embodiments.

The second reference voltage setting circuit 124 may receive the first data DQ<1:8> through the third data pad portion 121 in the first input mode and in the second input mode. The second reference voltage setting circuit 124 may receive the second data DQ<9:16> through the fourth data pad portion 122 in the first input mode. The second reference voltage setting circuit 124 may set a level of the second reference voltage VREF_CA2 in response to the training start signal CBT_EN, a second disposition selection signal DIR_SEL2, a second input selection signal DQMRS_SEL2, the first strobe signal DQS1, and the second strobe signal DQS2. The second buffer unit 123 may buffer the command/address signal CA to generate a second internal command/address signal ICA2, in response to the second reference voltage VREF_CA2.

The second disposition selection signal DIR_SEL2 may be set to have a logic "high" level if the third and fourth data pad portions 121 and 122 are disposed on an end of the second channel 12 opposite to the first channel 11. Alternatively, the second disposition selection signal DIR_SEL2 may be set to have a logic "low" level according to the embodiments. The second input selection signal DQMRS_SEL2 may be set to have a logic "low" level in the first set mode in which the second reference voltage setting circuit 124 adjusts a level of the second reference voltage VREF_CA2 using information stored in the second reference voltage setting circuit 124. Further, the second input selection signal DQMRS_SEL2 may be set to have a logic "high" level in the second set mode in which the second reference voltage setting circuit 124 adjusts a level of the second reference voltage VREF_CA2 using the first data DQ<1:8> or the second data DQ<9:16>. A logic level of the second input selection signal DQMRS_SEL2 may be set differently according to embodiments. The first strobe signal DQS1 may be enabled if the first data DQ<1:8> is inputted to the second channel 12 through the third data pad portion 121. A logic level of the first strobe signal DQS1 that is enabled may be set differently according to embodiments. The second strobe signal DQS2 may be enabled if the second data DQ<9:16> is inputted to the second channel 12 through the fourth data pad portion 122. A logic level of the second strobe signal DQS2 that is enabled may be set differently according to embodiments. Further, in one example, any one of the first set mode and the second set mode may be selected in response to an input selection signal DQMRS_SEL1 or DQMRS_SEL2 whose logic level is set according to a wire bonding process.

Figure 2:
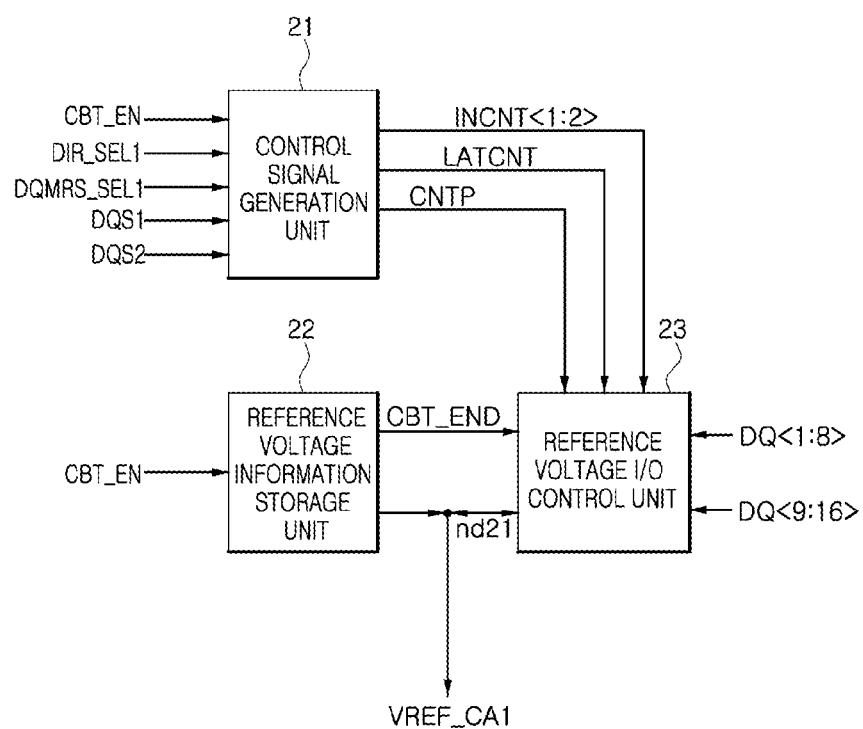
FIG. 2 is a block diagram illustrating a first reference voltage setting circuit included in the semiconductor device of FIG. 1.

Referring to FIG. 2, the first reference voltage setting circuit 114 may include a control signal generation unit 21, a reference voltage information storage unit 22 and a reference voltage input/output (I/O) control unit 23.

The control signal generation unit 21 may generate first and second input control signals INCNT<1:2>, a latch control signal LATCNT, and a control pulse CNTP in response to the training start signal CBT_EN, the first disposition selection signal DIR_SEL1, the first input selection signal DQMRS_SEL1, the first strobe signal DQS1 and the second strobe signal DQS2. The control signal generation unit 21 may generate the control pulse CNTP having a logic "high" level during a predetermined time-frame if the training start signal CBT_EN enabled to a logic "high" level is inputted to start a training operation. The control signal generation unit 21 may receive the first disposition selection signal DIR_SEL1 having a logic "low" level and the first input selection signal DQMRS_SEL1 having a logic "high" level to generate the first and second input control signals INCNT<1:2> in response to the first and second strobe signals DQS1 and DQS2. The control signal generation unit 21 may receive the first disposition selection signal DIR_SEL1 having a logic "low" level according to the disposition of elements in the first channel 11. The control signal generation unit 21 may generate the first input control signal INCNT<1> enabled to have a logic "high" level and the second input control signal INCNT<2> disabled to have a logic "low" level, if the first data DQ<1:8> are inputted to the first reference voltage setting circuit 114 to enable the first strobe signal DQS1 to have a logic "high" level. The control signal generation unit 21 may generate the first input control signal INCNT<1> disabled to have a logic "low" level and the second input control signal INCNT<2> enabled to have a logic "high" level, if the second data DQ<9:16> are inputted to the first reference voltage setting circuit 114 to enable the second strobe signal DQS2 to have a logic "high" level. The control signal generation unit 21 may generate the latch control signal LATCNT in response to the control pulse CNTP, the first strobe signal DQS1 and the second strobe signal DQS2. The control signal generation unit 21 may generate the latch control signal LATCNT having a logic "high" level if the control pulse CNTP is generated or at least one of the first and second strobe signals DQS1 and DQS2 is enabled to have a logic "high" level. A logic level of the latch control signal LATCNT may be set to be different according to the embodiments.

The reference voltage information storage unit 22 may set a level of the first reference voltage VREF_CA1 in response to the training start signal CBT_EN. More specifically, the reference voltage information storage unit 22 may set a level of the first reference voltage VREF_CA1 according to a frequency based on the information stored in the reference voltage information storage unit 22, and the reference voltage information storage unit 22 may output the first reference voltage VREF_CA1 through a node ND21, if the training start signal CBT_EN enabled to a logic "high" level is inputted to start a training operation in a first set mode. The second channel 12 may include an other reference voltage information storage unit which does substantially thing as the reference voltage as the voltage information storage unit. Accordingly, the other reference voltage information storage unit may output the second reference voltage VREF_CA2 if the training start signal CBT_EN is enabled to a logic "high" level is inputted to start a training operation. The reference voltage information storage unit 22 may delay the training start signal CBT_EN to generate a delayed training start signal CBT_END.

The reference voltage I/O control unit 23 may receive the first data DQ<1:8> or second data DQ<9:16> to set a level of the first reference voltage VREF_CA1, in response to the first and second input control signals INCNT<1:2>. More specifically, the reference voltage I/O control unit 23 may receive the first data DQ<1:8> to set a level of the first reference voltage VREF_CA1 if the first input control signal INCNT<1> is enabled, and the reference voltage I/O control unit 23 may also receive the second data DQ<9:16> to set a level of the first reference voltage VREF_CA1 if the second input control signal INCNT<2> is enabled, in one example, when the training operation starts in a second mode. An other reference voltage I/O control unit may be configured to set a level of second reference voltage VREF_CA2 according to the first data DQ<1:8> or the second data DQ<9:16> if the training operation starts in the second mode. The reference voltage I/O control unit 23 may latch a signal of the node ND21 in response to the latch control signal LATCNT. The reference voltage I/O control unit 23 may latch the first reference voltage VREF_CA1 in response to the control pulse CNTP. In response to the delayed training start signal CBT_END, the reference voltage I/O control unit 23 may buffer the latched signal of the node ND21 to output the buffer signal as the first reference voltage VREF_CA1.

Figure 3:
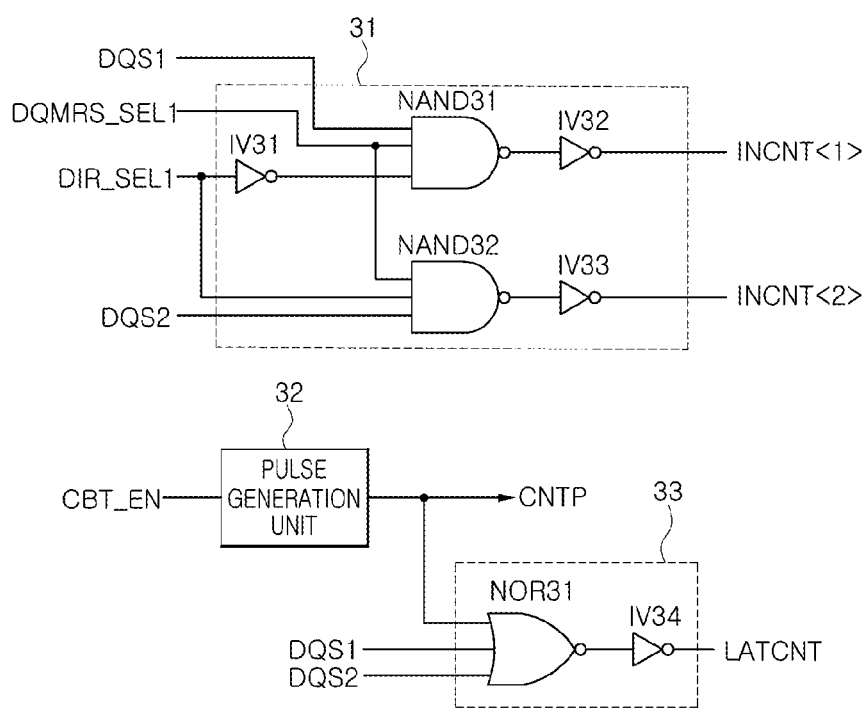
FIG. 3 is a circuit diagram illustrating a control signal generation unit included in the first reference voltage setting circuit of FIG. 2.

Referring to FIG. 3, the control signal generation unit 21 may include an input control signal generation unit 31, a pulse generation unit 32, and a latch control signal generation unit 33.

The input control signal generation unit 31 may be configured to include inverters IV31, IV32 and IV33, and NAND gates NAND31 and NAND32. The input control signal generation unit 31 may buffer the first control signal DQS1 and the second strobe signal DQS2 to generate the first and second input control signals INCNT<1:2> in response to the first disposition selection signal DIR_SEL1 and the first input selection signal DQMRS_SEL1. The input control signal generation unit 31 may receive the first disposition selection signal DIR_SEL1 set to a logic "low" level according to the disposition of elements in the first channel 11 and the first input selection signal DQMRS_SEL1 set to have a logic "high" level to generate the first and second input control signals INCNT<1:2>, where the input control signal generation unit 31 may generate the first and second input control signals INCNT<1:2> in response to the first and second strobe signals DQS1 and DQS2. The input control signal generation unit 31 may generate the first input control signal INCNT<1> enabled to a logic "high" level and the second input control signal INCNT<2> disabled to a logic "low" level, if the first data DQ<1:8> are inputted to the first reference voltage setting circuit 114 to enable the first strobe signal DQS1 to a logic "high" level. The input control signal generation unit 31 may generate the first input control signal INCNT<1> disabled to a logic "low" level and the second input control signal INCNT<2> enabled to a logic "high" level, if the second data DQ<9:16> are inputted to the first reference voltage setting circuit 114 to enable the second strobe signal DQS2 to a logic "high" level.

The pulse generation unit 32 may generate the control pulse CNTP having a logic "high" level during a predetermined time-frame if the training start signal CBT_EN enabled to a logic "high" level is inputted to start a training operation.

The latch control signal generation unit 33 may be configured to include a NOR gate NOR31 and an inverter IV34 connected to an output terminal of the NOR gate NOR31. The latch control signal generation unit 33 may generate the latch control signal LATCNT in response to the control pulse CNTP, the first strobe signal DQS1 and the second strobe signal DQS2. The latch control signal generation unit 33 may generate the latch control signal LATCNT having a logic "high" level if a control pulse CNTP having a logic "high" level is generated or if at least one of the first and second strobe signals DQS1 and DQS2 is enabled to have a logic "high" level.

Figure 4:
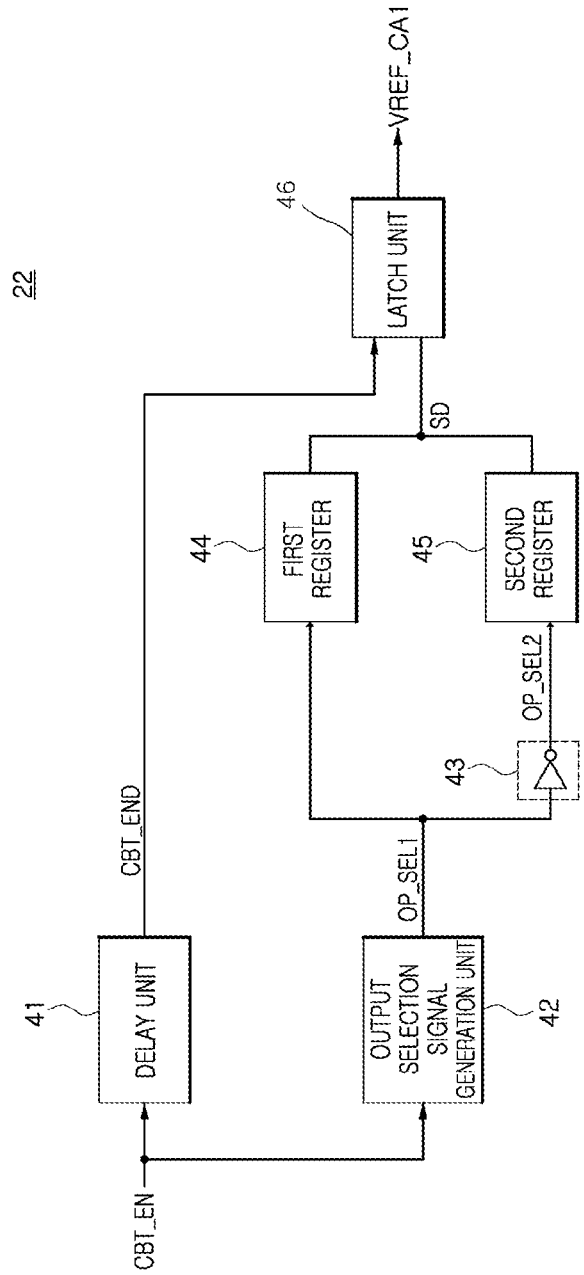
FIG. 4 is a block diagram illustrating a reference voltage information storage unit included in the first reference voltage setting circuit of FIG. 2.

Referring to FIG. 4, the reference voltage information storage unit 22 may include a delay unit 41, an output selection signal generation unit 42, a buffer 43, a first register 44, a second register 45, and a latch unit 46.

The delay unit 41 may delay the training start signal CBT_EN by a predetermined delay time to generate the delayed training start signal CBT_END. That is, the delayed training start signal CBT_END may be enabled after a predetermined delay time from a time that the training start signal CBT_EN is enabled to a logic "high" level to start the training operation.

The output selection signal generation unit 42 may generate a first output selection signal OP_SEL1 in response to the training start signal CBT_EN. More specifically, the output selection signal generation unit 42 may generate the first output selection signal OP_SEL1 enabled to have a logic "high" level while the training start signal CBT_EN is disabled to have a logic "low" level. The output selection signal generation unit 42 may also generate the first output selection signal OP_SEL1 disabled to have a logic "low" level while the training start signal CBT_EN is enabled to have a logic "high" level. A logic level of an enabled first output selection signal OP_SEL1 may be set according to the embodiment.

The buffer 43 may inversely buffer the first output selection signal OP_SEL1 to generate a second output selection signal OP_SEL2. More specifically, the buffer 43 may generate the second output selection signal OP_SEL2 disabled to a logic "low" level if the first output selection signal OP_SEL1 is enabled to a logic "high" level. The buffer 43 may also generate the second output selection signal OP_SEL2 enabled to have a logic "high" level if the first output selection signal OP_SEL1 is disabled to a logic "low" level.

The first register 44 may include information used to set a level of the first reference voltage VREF_CA1 at a high frequency. The first register 44 may store information according to a mode register set (MRS) operation which is executed during an initialization operation of the semiconductor device 1 which may be used to set a level of the first reference voltage VREF_CA1. The first register 44 may output the information stored therein as selection data SD if the first output selection signal OP_SEL1 is enabled to a logic "high" level. In some embodiments, the first register 44 may be configured to include information used to set a level of the first reference voltage VREF_CA1 at a low frequency. In a substantially similar manner, the second channel 12 may include an other reference voltage information storage unit which includes a third register configured to include information used to set a level of the second reference voltage VREF_CA2.

The second register 45 may include information used to set a level of the first reference voltage VREF_CA1 at a low frequency. The second register 45 may store information according to the MRS operation which is executed during the initialization operation of the semiconductor device 1. The second register 45 may output the information stored therein as the selection data SD if the second output selection signal OP_SEL2 is enabled to have a logic "high" level. In some embodiments, the second register 45 may be configured to include information used to set a level of the first reference voltage VREF_CA1 at a high frequency. In a substantially similar manner, the second channel 12 may include an other reference voltage information storage unit which includes a fourth register configured to include information used to set a level of the second reference voltage VREF_CA2.

The latch unit 46 may receive and latch the selection data SD and may output the latched selection data SD as the first reference voltage VREF_CA1 in response to the delayed training start signal CBT_END. More specifically, the latch unit 46 may output the latched selection data SD as the first reference voltage VREF_CA1 if the delayed training start signal CBT_END is enabled to a logic "high" level.

Figure 5:
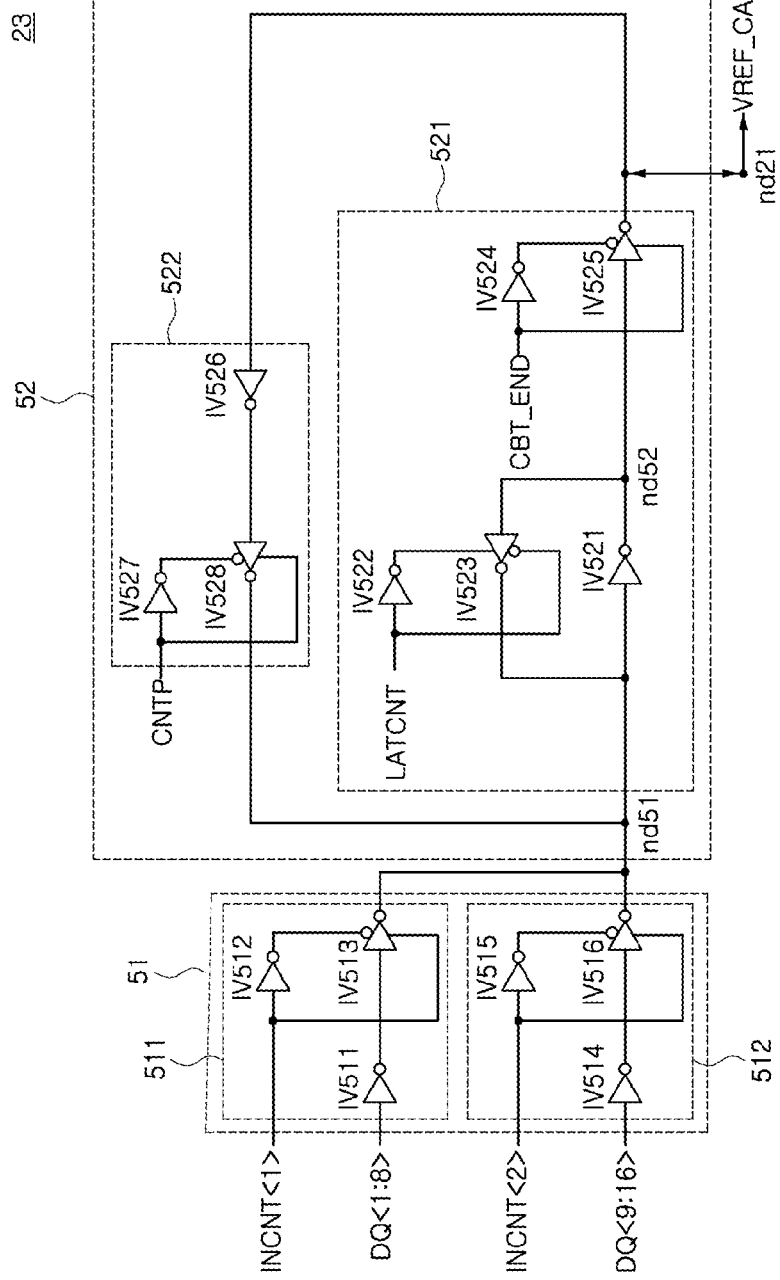
FIG. 5 is a circuit diagram illustrating a reference voltage input/output control unit included in the first reference voltage setting circuit of FIG. 2.

Referring to FIG. 5, the reference voltage I/O control unit 23 may include selection input or a selection input unit 51 and a reference voltage latch or a reference voltage latch unit 52.

The selection input unit 51 may include a first input or a first input unit 511 and a second input or a second input unit 512. The first input unit 511 may include inverters IV511, IV512, and IV513. The first input unit 511 may buffer the first data DQ<1:8> to output the buffered first data through a node ND51 in response to the first input selection signal DQMRS_SEL1 if the first input control signal INCNT<1> is enabled to a logic "high" level. The second input unit 512 may include inverters IV514, IV515, and IV516. The second input unit 512 may buffer the second data DQ<9:16> to output the buffered second data through the node ND51 in response to the second input selection signal DQMRS_SEL2 if the second input control signal INCNT<2> is enabled to a logic "high" level.

The reference voltage latch unit 52 may include a latch output or latch output unit 521 and a feedback or feedback unit 522. The latch output unit 521 may include inverters IV521, IV522, IV523, IV524, and IV525. The latch output unit 521 may inversely buffer and latch a signal of the node ND51 to output the inversely buffered signal through a node ND52. The latch output unit 521 may latch signals of the nodes ND51 and ND52 if the latch control signal LATCNT has a logic "low" level. The latch output unit 521 may inversely buffer a signal of the node ND51 to output the inversely buffered signal as the first reference voltage VREF_CA1, in response to the delayed training start signal CBT_END. More specifically, the latch output unit 521 may inversely buffer a signal of the node ND51 to output the inversely buffered signal through the node ND21 if the delayed training start signal CBT_END is enabled to have a logic "high" level. The feedback unit 522 may include inverters IV526, IV527, and IV528 and may feed back a signal of the node ND21 in response to the control pulse CNTP. More specifically, the feedback unit 522 may buffer a signal of the node ND21 through which the first reference voltage VREF_CA1 is outputted and may transmit the buffered signal to the node ND51 while the control pulse CNTP has a logic "high" level in response to the training start signal CBT_EN. As such, the reference voltage latch unit 52 may receive and latch the first reference voltage VREF_CA1 whose level is set by the reference voltage information storage unit 22.

A training operation of the semiconductor device 1 having the aforementioned configuration will be described hereinafter in conjunction with an example in which a level of the first reference voltage VREF_CA1 is set according to the first data DQ<1:8> in the first channel 11 of the semiconductor device 1 illustrated in FIG. 1. Further, another example is described in which a level of the first reference voltage VREF_CA1 is set based on the information stored in the first and second registers 44 and 45 in the first channel 11 of the semiconductor device 1 illustrated in FIG. 1.

If the training start signal CBT_EN is enabled to a logic "high" level while the first disposition selection signal DIR_SEL1 has a logic "low" level and the first input selection signal DQMRS_SEL1 has a logic "high" level, the first reference voltage setting circuit 114 may adjust a level of the first reference voltage VREF_CA1 according to the first data DQ<1:8> inputted through the first data pad portion 111 while the first strobe signal DQS1 is enabled, or the first reference voltage setting circuit 114 may adjust a level of the first reference voltage VREF_CA1 according to the second data DQ<9:16> inputted through the second data pad portion 112 while the second strobe signal DQS2 is enabled.

If the training start signal CBT_EN is enabled to a logic "high" level while the first disposition selection signal DIR_SEL1 has a logic "low" level and the first input selection signal DQMRS_SEL1 has a logic "low" level, the first reference voltage setting circuit 114 may set a level of the first reference voltage VREF_CA1 based on the information stored in the first and second registers 44 and 45.

Figure 6:
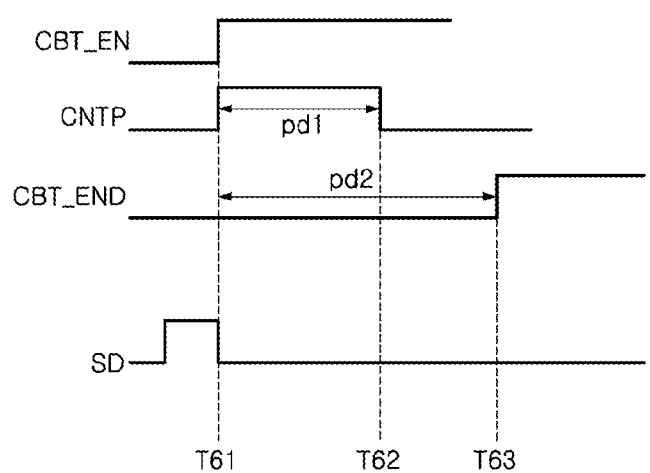
FIG. 6 is a timing diagram illustrating a training operation of a level of a reference voltage that is adjusted according to information stored in the reference voltage information storage unit of FIG. 4.

Referring to FIG. 6, the training operation first reference voltage VREF_CA1 level is set based on the information stored in the first and second registers 44 and 45 and may be confirmed. If the training start signal CBT_EN is enabled to have a logic "high" level, the control pulse CNTP may be generated to have a pulse width corresponding to an interval from a time "T61" until time "T62" that a first duration PD1 elapses after the point of time "T61". The delayed training start signal CBT_END may be enabled to have a logic "high" level at a point of time "T63" that a second duration PD2 elapses after the point of time "T61".

The information of a logic "high" level stored in the first register 44 may be outputted as the selection data SD before the time "T61". The information of a logic "low" level stored in the second register 45 may be outputted as the selection data SD after the time "T61". The selection data SD may be outputted as the first reference voltage VREF_CA1 after the time "T63".

As described above, a semiconductor device according to an embodiment may receive data without any errors to set a level of a reference voltage even though positions of data pads receiving the data are changed according to an input mode and a disposition status when two channels are combined with each other. In addition, the semiconductor device according to an embodiment may store information for adjusting a level of the reference voltage according to a high frequency or a low frequency using a mode register set (MRS) operation and may adjust a level of the reference voltage at a high speed based on the information stored therein.

Figure 7:
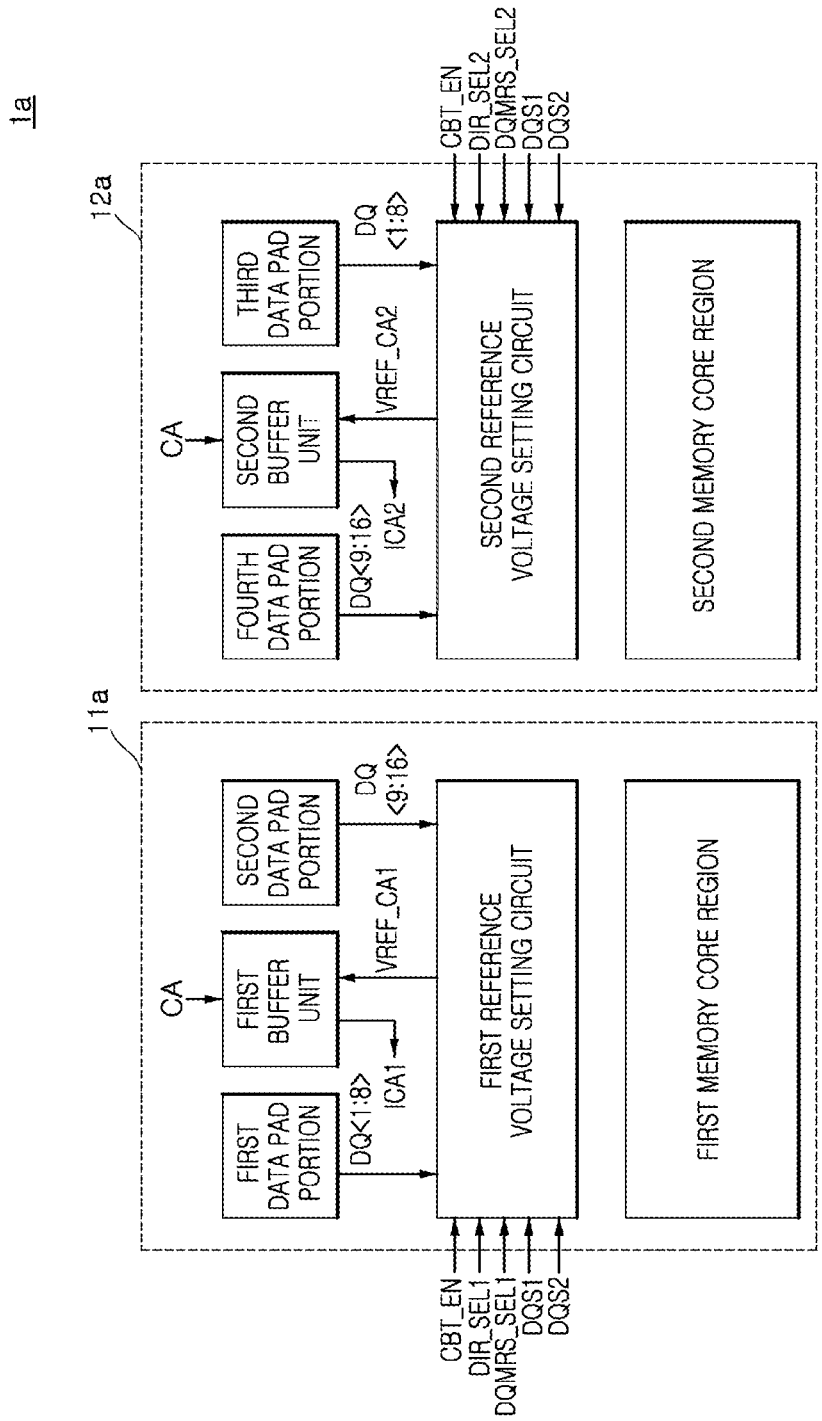
FIG. 7 is a block diagram illustrating a semiconductor device according to another embodiment.

Referring to FIG. 7, a semiconductor device 1a according to another embodiment is illustrated. The semiconductor device 1a may include a first channel 11a and a second channel 12a. The first and second channels 11a and 12a included in the semiconductor device 1a illustrated in FIG. 7 may be arrayed in a row, whereas the first and second channels 11 and 12 included in the semiconductor device 1 illustrated in FIG. 1 are arrayed in a column. The first channel 11a of FIG. 7 may have substantially the same configuration as the first channel 11 illustrated in FIG. 1, and the second channel 12a of FIG. 7 may have substantially the same configuration as the second channel 12 illustrated in FIG. 1. Accordingly, detailed descriptions of the first and second channels 11a and 12a will be omitted hereinafter.

Directions that the first and second channels 11a and 12a receive various signals may be set differently according to the embodiments. For example, the first channel 11a may receive the command/address signal CA, the training start signal CBT_EN, the first disposition selection signal DIR_SEL1, the first input selection signal DQMRS_SEL1, the first strobe signal DQS1, and the second strobe signal DQS2 in any one direction among various directions such as a downward direction, an upward direction, a leftward direction and a rightward direction in FIG. 7. Similarly, the second channel 12a may also receive the command/address signal CA, the training start signal CBT_EN, the second disposition selection signal DIR_SEL2, the second input selection signal DQMRS_SEL2, the first strobe signal DQS1, and the second strobe signal DQS2 in any one direction among various directions such as the downward direction, the upward direction, the leftward direction and the rightward direction in FIG. 7.

Figure 8:
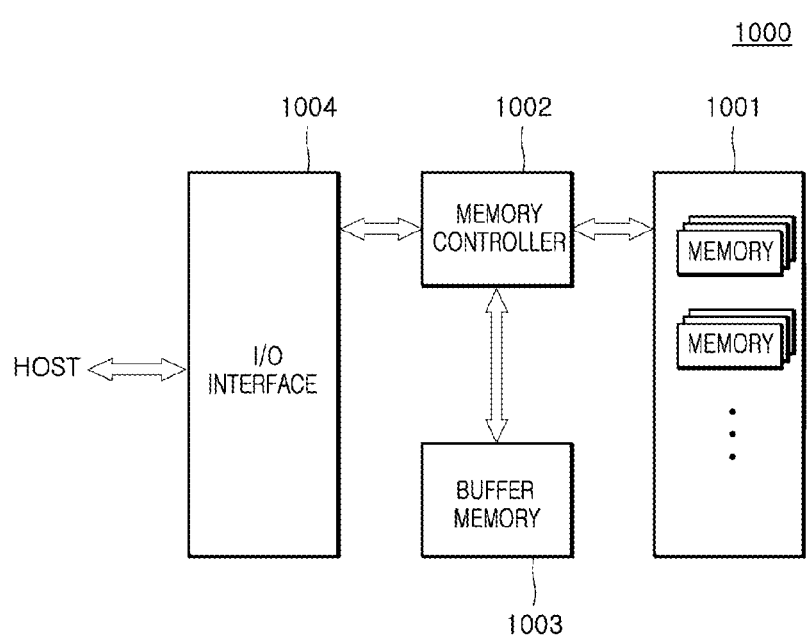
FIG. 8 is a block diagram illustrating an electronic system including at least one of the semiconductor devices illustrated in FIGS. 1 to 7.

At least one of the semiconductor devices described with reference to FIGS. 1 to 7 may be applied to an electronic system that includes a memory system, a graphic system, a computing system, a mobile system, or the like. For example, an electronic system 1000 according an embodiment may include a data storage unit 1001, a memory controller 1002, a buffer memory 1003, and an I/O interface 1004, as illustrated in FIG. 8.

The data storage unit 1001 may store data which is outputted from the memory controller 1002 or may read and output the stored data to the memory controller 1002, according to a control signal generated from the memory controller 1002. The data storage unit 1001 may include the semiconductor device 1 illustrated in FIG. 1 or the semiconductor device 1a illustrated in FIG. 7. Meanwhile, the data storage unit 1001 may include a nonvolatile memory that can retain stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage unit 1001 or the buffer memory 1003, or the memory controller 1002 may decode the command to control an operation for outputting the data stored in the data storage unit 1001 or the buffer memory 1003. Although FIG. 8 illustrates the memory controller 1002 with a single block, the memory controller 1002 may include one controller for controlling the data storage unit 1001 comprised of a nonvolatile memory and another controller for controlling the buffer memory 1003 comprised of a volatile memory.

The buffer memory 1003 may temporarily store the data which is processed by the memory controller 1002. That is, the buffer memory 1003 may temporarily store data which is outputted from or to inputted to the data storage unit 1001. The buffer memory 1003 may store the data, which is outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
a first channel configured to include a first data pad portion receiving first data in a first input mode and in a second input mode and a second data pad portion receiving second data in the first input mode, wherein the first channel is configured to set a level of a first reference voltage according to the first data or the second data; and
a second channel configured to include a third data pad portion receiving the first data in the first and second input modes and a fourth data pad portion receiving the second data in the first input mode, wherein the second channel is configured to set a level of a second reference voltage according to the first data or the second data,
wherein the first channel sets the level of the first reference voltage according to information stored in a first register when the semiconductor device operates at a first frequency, and sets the level of the first reference voltage according to information stored in a second register when the semiconductor device operates at a second frequency.

2. The semiconductor device of claim 1,
wherein the first and second data pad portions are disposed on an end of the first channel opposite to the second channel; and
wherein the third and fourth data pad portions are disposed on an end of the second channel opposite to the first channel.

3. The semiconductor device of claim 1, wherein the first channel includes:
a first reference voltage information storage unit configured to set the level of the first reference voltage according to information stored in the first register or the second register when a training operation starts in a first set mode; and
a first reference voltage input/output (I/O) control unit configured to set the level of the first reference voltage according to the first data or the second data when the training operation starts in a second set mode.

4. The semiconductor device of claim 3,
wherein the information stored in the first register and the second register is set according to a mode register set (MRS) operation which is executed during an initialization operation of the semiconductor device.

5. The semiconductor device of claim 3, wherein the first reference voltage I/O control unit includes:

a selection input unit configured to selectively transmit the first data or the second data to an input node in response to a first input selection signal and a second input selection signal; and
a reference voltage latch unit configured to latch a signal of the input node, configured to output the latched signal of the input node as the first reference voltage in response to a delayed training start signal, and configured to receive and latch the first reference voltage whose level is set by the first reference voltage information storage unit.

6. The semiconductor device of claim 5, wherein the reference voltage latch unit includes:
a latch output unit configured to latch a signal of the input node in response to a latch control signal and configured to buffer the signal of the input node to output the buffered signal in response to the delayed training start signal; and
a feedback unit configured to transmit the first reference voltage to the input node in response to a control pulse which is generated in response to a training start signal.

7. The semiconductor device of claim 3, further comprising a control signal generation unit configured to generate a first input control signal, a second input control signal, a latch control signal, and a control pulse in response to a training start signal, a disposition selection signal, an input selection signal, a first strobe signal, and a second strobe signal.

8. The semiconductor device of claim 7, wherein the control signal generation unit includes:
an input control signal generation unit configured to buffer the first and second strobe signals to generate the first input control signal and the second input control signal, in response to the disposition selection signal and the input selection signal;
a pulse generation unit configured to generate the control pulse in response to the training start signal; and
a latch control signal generation unit configured to generate the latch control signal in response to the control pulse, the first strobe signal and the second strobe signal.

9. The semiconductor device of claim 3, wherein the second channel includes:
a second reference voltage information storage unit configured to set the level of the second reference voltage according to information stored in a third register or a fourth register when the training operation starts in the first set mode; and
a second reference voltage input/output (I/O) control unit configured to set the level of the second reference voltage according to the first data or the second data when the training operation starts in the second set mode.

10. The semiconductor device of claim 1, wherein the first and second channels are arrayed in a column or a row.

* * * * *